United States Patent [19]

Wang

[11] Patent Number: 5,534,391
[45] Date of Patent: Jul. 9, 1996

[54] AZIRIDINE PRIMER FOR FLEXOGRAPHIC PRINTING PLATES

[75] Inventor: Paul J. Wang, Woodbury, Minn.

[73] Assignee: Minnesota Mining and Manufacturing Company, St. Paul, Minn.

[21] Appl. No.: 189,075

[22] Filed: Jan. 28, 1994

[51] Int. Cl.$^6$ .................................................... G03C 1/73
[52] U.S. Cl. .................................... 430/271.1; 430/287.1; 430/18; 430/306
[58] Field of Search ....................................... 430/271, 300, 430/287, 18, 306, 286.1

[56] References Cited

U.S. PATENT DOCUMENTS

| | | | |
|---|---|---|---|
| 3,017,280 | 1/1962 | Yudelson | 106/125 |
| 3,264,103 | 8/1966 | Cohen et al. | 96/28 |
| 3,704,167 | 11/1972 | Yamamoto et al. | 117/239 |
| 4,162,919 | 7/1979 | Richter et al. | 96/87 R |
| 4,167,414 | 9/1979 | Morgan | 96/87 R |
| 4,181,528 | 1/1980 | Work et al. | 428/474 |
| 4,241,169 | 12/1980 | Work et al. | 430/532 |
| 4,264,705 | 4/1981 | Allen | 430/271 |
| 4,369,246 | 1/1983 | Chen et al. | 430/300 |
| 4,418,164 | 11/1983 | Logullo et al. | 523/207 |
| 4,423,135 | 12/1983 | Chen et al. | 430/271 |
| 4,749,617 | 6/1988 | Canty | 428/332 |
| 4,927,723 | 5/1990 | Cusdin | 430/15 |
| 4,939,008 | 7/1990 | Kemski | 428/34.3 |
| 5,015,556 | 5/1991 | Martens | 430/306 |
| 5,057,371 | 10/1991 | Canty et al. | 428/411.1 |
| 5,175,076 | 12/1992 | Ishikawa et al. | 430/281 |
| 5,187,044 | 2/1993 | Prioleau et al. | 430/271 |
| 5,215,859 | 6/1993 | Martens | 430/254 |
| 5,322,761 | 6/1994 | Kausch et al. | 430/300 |

FOREIGN PATENT DOCUMENTS 1454191  10/1976  United Kingdom .

*Primary Examiner*—George F. Lesmes
*Assistant Examiner*—Laura Weiner
*Attorney, Agent, or Firm*—Gary L. Griswold; Walter N. Kirn; Christine T. O'Shaughnessy

[57] ABSTRACT

The invention is a flexible plate, suitable for use as a flexographic printing plate, comprising a flexible substrate primed with an aziridine functional material, and, contacting a primed surface of said substrate, a photosensitive layer which comprises a substantially polar acrylate compound, an elastomeric block copolymer, and a photoinitiator. The adhesion between the substrate and the photosensitive layer is strengthened by use of the aziridine functional primer in combination with a substantially polar acrylate compound. In contrast, when acrylate compounds with large nonpolar portions are used, the adhesion tends to be poor. The adhesion is further improved by exposure of the plate to radiation.

4 Claims, No Drawings

AZIRIDINE PRIMER FOR FLEXOGRAPHIC PRINTING PLATES

BACKGROUND

1. Field of the Invention

The present invention relates to multilayer flexographic printing plates and particularly to primer layers in such plates.

2. Background of the Invention

Flexography is a term that broadly applies to a printing format which uses a flexible substrate bearing an elastomeric or rubbery relief printing surface.

The first flexographic printing plates were produced from natural or synthetic rubber compositions which were cured chemically under heat and pressure in a mold utilizing conventional rubber curatives such as mercapto compounds (*Flexography: Principles and Practices,* 3rd Edition, Flexographic Technical Association, p. 158–162). More recently, photopolymer elastomeric compositions (elastomer containing compositions curable upon exposure to actinic radiation) have been used to produce relief printing plates. For example, U.S. Pat. No. 4,162,919 describes the use of a photosensitive composition containing a block copolymer as an elastomeric polymeric binder, a compatible ethylenically unsaturated monomer, and a photoinitiator. Similarly, British Patent 1,454,191 describes the use of an elastomeric polyurethane based photosensitive layer. In both cases, the standard solvent wash procedure is used to develop the relief layer after exposure to actinic radiation. European Patent 261,910 describes a water-developable flexographic printing plate. U.S. Pat. No. 5,015,556 discloses a thermal developable system.

Aziridine functional materials have been used to improve bonding between various types of materials. For example, aziridine functional materials have been incorporated into functional coatings (e.g., reflective layers, antihalation layers, etc.) which contain groups reactive with the aziridine functionality. These coatings are then applied to a substrate. See, for example, U.S. Pat. Nos. 3,017,280; 4,167,414; 4,181,528; and 4,241,169.

U.S. Pat. No. 3,704,167 discloses the use of polyaziridine-functional materials to improve the adhesion of a subsequently applied magnetic recording layer to an antihalation layer on motion picture film.

U.S. Pat. No. 4,749,617 discloses a composite article wherein two rigid materials are joined to one another via an intermediate layer made up of an aziridine-functional material and an organic resin.

U.S. Pat. No. 5,057,371 discloses the application of a composition, consisting essentially of at least one aziridine functionality or group, to a substrate. Subsequently applied layers of magnetic recording media, photographic layers, adhesives, radiation sensitive compositions and silanes may be applied to the aziridine-treated surface.

U.S. Pat. No. 4,939,008 describes an aziridine functional layer which is used to bond a polyolefin layer to a polymeric substrate.

U.S. Pat. No. 5,187,044 describes use of an aziridine functional composition as a primer layer on a flexible substrate to which a photosensitive polyurethane composition is then applied to form a flexographic printing plate.

SUMMARY OF THE INVENTION

In a first embodiment, the invention is a flexible plate comprising a flexible substrate primed with an aziridine functional material, and, contacting a primed surface of said substrate, a first photosensitive layer which comprises a substantially polar acrylate compound, an elastomeric block copolymer, and a photoinitiator. The adhesion between the substrate and the photosensitive layer is strengthened by use of the aziridine functional primer in combination with a substantially polar acrylate compound. In contrast, when acrylate compounds with large nonpolar portions are used, the adhesion tends to be poor. The adhesion is further improved by exposure of the plate to radiation.

In a second embodiment, the flexible plate further comprises a second photosensitive layer which is applied after the first photosensitive layer has been cured.

In another embodiment, the invention is a flexographic printing plate comprising a) a flexible substrate having at least one surface primed with an aziridine functional material, and b) a first layer, which contacts the primed surface of the substrate, and which comprises a substantially polar acrylate compound, an elastomeric block copolymer, and a photoinitiator, the first photosensitive layer being partially cured by irradiation through the substrate, then being image-wise exposed to actinic radiation and developed to reveal a relief image.

Alternatively, the flexographic printing plate may comprise a) a flexible substrate having at least one surface primed with an aziridine functional material, b) a first layer, which contacts the primed surface of the substrate, and which comprises a photoinitiated reaction product of photosensitive precursors comprising a substantially polar acrylate, an elastomeric block copolymer, and a photoinitiator, and c) a second relief bearing layer over the first layer, the second layer comprising the photoinitiated reaction product of photosensitive precursors comprising an acrylate compound which is substantially non-polar, an elastomeric block copolymer, and a photoinitiator.

DETAILED DESCRIPTION OF THE INVENTION

The substrate may be any flexible material including metal sheets, plastic films, open or closed celled foams, compressible rubber, or some combination of the preceding materials. Plastics, especially polyesters, are well suited for use as the flexible substrate. The substrate is preferably 0.1 to 1.5 mm thick.

The aziridine functional material used as the primer on the substrate may be diluted with solids that comprise inert compatible polymeric organic binders, coupling agents, particulates, comonomers, other priming agents and the like. It is preferred that the aziridine comprise at least 40 to 70% by weight solids of the layer, more preferably at least 90% by weight of the layer, and most preferably 100% by weight of the solid content of the layer.

The aziridine-containing compound may also contain other functional groups. Preferably these groups are not reactive with the aziridine functionality under ambient conditions. Thus, for example, the aziridine-functional compound may also contain one or more hydroxyl groups.

The aziridine-functional compounds useful in the present invention may be represented by the formula

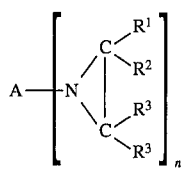

wherein A is an n-valent organic or inorganic group, n is a whole number of at least one (preferably 2 to 4), and $R^1$, $R^2$, $R^3$, and $R^4$ may be the same or different and are individually selected from the group consisting of hydrogen and lower alkyl (branched or straight chain) groups containing from 1 to 8 (preferably from 1 to 4) carbon atoms.

The nitrogen atom of the aziridine group is preferably linked to an atom having a valence of 4 to 5 (most preferably C or P). Preferably, $R^1$, $R^2$, and $R^3$ are each hydrogen and $R^4$ is selected from hydrogen and alkyl containing from 1 to 4 (most preferably 1 to 2) carbon atoms.

"A" may be an aliphatic, aromatic or alicyclic organic radical which may contain atoms such as oxygen, sulfur, nitrogen, etc. "A" may also be an inorganic radical, such as

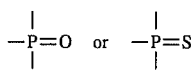

"A" preferably is

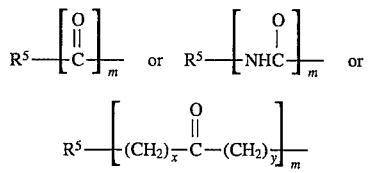

wherein $R^5$ is an m-valent aliphatic, aromatic or alicyclic radical which may contain atoms other than carbon, e.g., oxygen, nitrogen or sulfur, m is a whole number of at least 1, and x and y are individually 0, 1, or 2.

Specific examples of useful aziridine-containing materials include

A. "CX-100" available from Polyvinyl Chemical Industries and believed to have the formula

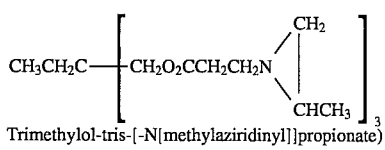
Trimethylol-tris-[-N[methylaziridinyl]]propionate) (Formula A)

B. "XAMA-7" available from Cordova Chemical Company and believed to have the formula

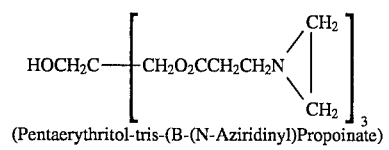
(Pentaerythritol-tris-(B-(N-Aziridinyl)Propoinate)) (Formula B)

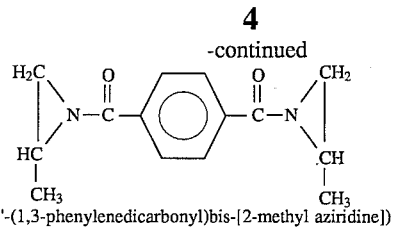
(1,1'-(1,3-phenylenedicarbonyl)bis-[2-methyl aziridine]) (Formula C)

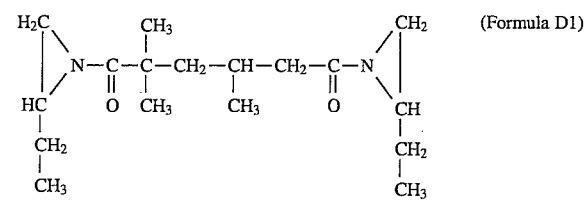
(Formula D1)

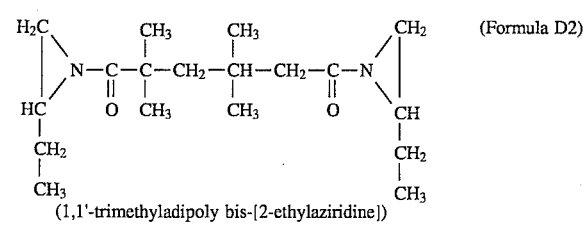
(1,1'-trimethyladipoly bis-[2-ethylaziridine]) (Formula D2)

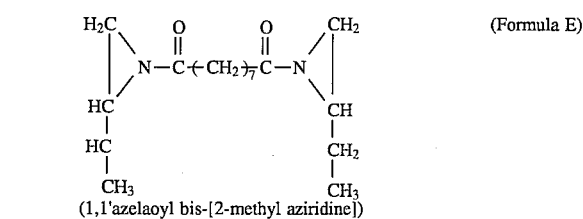
(1,1'azelaoyl bis-[2-methyl aziridine]) (Formula E)

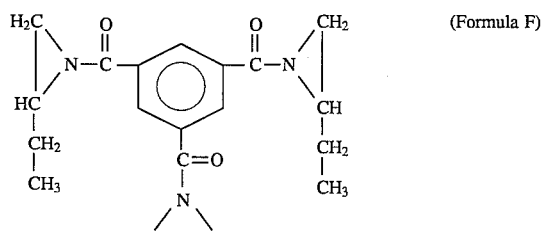
(1,1'1''-(1,3,5-benzenetriyltricarbonyl)-tris-[2-ethylaziridine]) (Formula F)

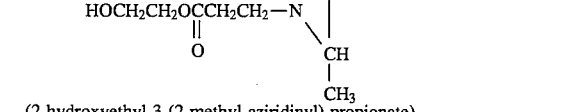
(2-hydroxyethyl-3-(2-methyl aziridinyl)-propionate) (Formula G)

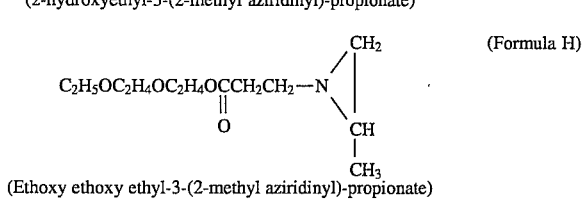
(Ethoxy ethoxy ethyl-3-(2-methyl aziridinyl)-propionate) (Formula H)

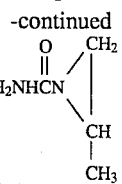

(Formula I)

(2-methyl aziridinyl-2-(2-methyl propenoyloxy)ethyl ur

The aziridine-functional layer preferably has a thickness of less than about 0.1 μm, more preferably has a thickness in the range from 0.01 to 0.075 μm, most preferably has a thickness of from about 0.03 to 0.05 μm.

The application of the aziridine containing primer layer can be performed in a variety of ways. For example, the surface of the substrate may be contacted with a composition comprising the aziridine containing compound by such techniques as brushing, spraying, roll coating, curtain coating, knife coating, etc. The coated surface may then be processed for a time at a temperature sufficient to dry the coating. In a preferred embodiment the substrate is corona treated prior to the application of the aziridine containing material.

The photosensitive layer comprises an acrylate compound which is substantially polar, an elastomer, and a photoinitiator. "Acrylate compounds" herein indicate compounds that have at least one acrylate or methacrylate group. By substantially polar acrylate compound is meant a compound which does not have large nonpolar domains. It was found that generally the acrylate compounds with more carbon atoms and with lower polarity provide less adhesion. A large number of sterically hindered carbons is especially detrimental to the adhesion. However, presence of a large number of carbon atoms has been found not to be detrimental if they are part of a polar group, such as an aromatic ring. Thus, acrylate compounds useful for the present invention are preferably selected from acrylate compounds having fewer than five carbon atoms (exclusive of the carbon atoms in the acrylate group) per acrylate group, acrylate compounds having fewer than five sterically hindered carbons per acrylate group, and acrylate compounds which have more than five carbon atoms (exclusive of the carbon atoms in the acrylate group) per acrylate group but in which the carbon atoms are present in an aromatic ring. Non-limiting examples of suitable acrylate compounds include triethylene glycol diacrylate, which has three carbons per acrylate group; polyethylene glycol 200 diacrylate, which has 4 carbons per acrylate group; neopentyl glycol diacrylate, which has 2.5 carbon atoms per acrylate group; propoxylated trimethylolpropane triacrylate (TMPTA), which has 4.3 carbons per acrylate group. Another suitable acrylate compound is ethoxylated bisphenol A diacrylate, which has more than 5 carbon atoms per acrylate group. However, most of the carbon atoms are found in the two benzene rings. Since benzene is fairly polar, the greater number of carbon atoms is not detrimental.

The amount of acrylate compound used in the photosensitive layer is preferably greater than 2% by weight of the photosensitive layer, and more preferably at least 5% by weight. Mixtures of acrylate compounds may be used. However, at least one of the acrylate compounds used must be a substantially polar acrylate compound. The amount of substantially polar acrylate compound should be at least 20%, and more preferably at least 25%, by total weight of the acrylate compounds.

The elastomer is preferably a thermoplastic, elastomeric block copolymer. An A-B-A type block copolymer, where A is a nonelastomeric block, preferably a vinyl polymer and most preferably polystyrene and B is an elastomeric block, preferably polybutadiene or polyisoprene is especially desirable. The nonelastomer to elastomer ratio is preferably in the range of 10:90 to 35:65. Styrene-isoprene-styrene block copolymers are especially preferred.

The photoinitiator is a compound which generates free radicals upon exposure to actinic radiation. Any of the known classes of photoinitiators, particularly free radical photoinitiators such as quinones, benzophenones, benzoin ethers, aryl ketones, peroxides, biimidazoles, diaryliodoniums, triarylsulfoniums and phosphoniums, diazoniums, etc. Alternately, the photoinitiator may be a mixture of compounds, one of which provides the free radicals when caused to do so by a sensitizer activated by radiation.

Thus, according to one preferred embodiment the flexible photosensitive plate comprises a flexible substrate primed with an aziridine functional material, and contacting the primed substrate, a first photosensitive layer which comprises a 3 to 50 parts by weight of a substantially polar acrylate compound, 20 to 90 parts by weight of an elastomeric block copolymer, and 0.5 to 5 parts by weight of a photoinitiator.

Additional additives, such as colorants, processing aids, antiozonants, spectral sensitizers, and antioxidants, may be added if desired. Processing aids may be such things as low molecular weight polymers compatible with the elastomeric block copolymer, such as a low molecular weight α-methylstyrene polymer or copolymer, or fluorinated surfactants. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

Adhesion between the substrate and the photosensitive layer may be further improved by exposure of the flexible plate to radiation. This may be accomplished by exposure to radiation through the substrate. The radiation may be e-beams, short wavelength ultra violet, etc. This step also may be used to partially cure the photosensitive layer to establish a floor. After this back exposure to radiation, the flexible plate may be image-wise exposed to radiation. The photosensitive layer is thereby cured in an image-wise fashion. Development of the plate to expose the relief image may be accomplished by any known means, including solvent wash, aqueous wash, or thermal development.

In one preferred embodiment the first photosensitive layer is cured by overall exposure to radiation and a second photosensitive layer is applied over the first layer. The second photosensitive layer preferably comprises a thermoplastic elastomer, a photoinitiator, and a high molecular weight cross-linking agent. This cross-linking agent is preferably an ethylenically unsaturated oligomer, preferably a polyacryloyl oligomer with a molecular weight greater than 1000, more preferably greater than 2000, and most preferably greater than 3000. In this embodiment it may be desirable to add some of this oligomer to the first photosensitive layer to improve adhesion between the two photosensitive layers. Since the oligomer has large regions that are not substantially polar, the amount of oligomer added can not be more than 80% by weight of acrylate compounds (i.e., by weight of substantially polar acrylate compound plus polyacryloyl oligomer).

This flexographic plate with a second photosensitive layer may be image-wise exposed. Development of the image-wise cured relief layer may be accomplished by any known development method. However, such plates are especially suitable for thermal development.

EXAMPLES

Example 1

A roll of 4.6 mil (0.12 mm) and a roll of 7 mil (0.18 mm) of polyethylene terephthalate (PET) film was corona treated in air. The corona treater was run at a speed of 11 m/min. The treated film was coated with 0.4% solid aziridine functional compound in isopropyl alcohol (CX-100 from Polyvinyl Chemical Co.). The film was dried at 94–106° C. The thickness of the coating is in the range of several hundred angstroms.

Example 2

A photopolymer composition was prepared by dissolving the ingredients in toluene. The material was dried for several days in a TEFLON coated casting plate, and then the photopolymer was pressed onto the primed PET film described in Example 1. The thickness of the photopolymer composition ranged from 25 to 35 mil (0.63–0.89 mm).

The photopolymer composition was 80.3 parts by weight Kraton 1117™(a styrene-isoprene-styrene block copolymer); 7.4 parts Picotex™ 120 (an alpha methyl styrene copolymer); 1.3 parts Irgacure™ 651 (photoinitiator); 0.5 parts Erganox™ 1076 (antioxidant); and 10.0 parts acrylate monomer.

The ASTM D903 180 degree peel test was performed on the sample. Another sample with the same composition was irradiated by UV light for 40 seconds and was then tested again according to the ASTM D903 180 degree peel test. The results for various acrylate monomers are shown in Table 1.

An average peel force greater than 5 lb/in (0.85 N/m) is considered adequate. Generally, the adhesion improved after irradiation. Note that propoxylated neopentyl glycol diacrylate and polybutadiene diacrylate did not attain acceptable adhesion even after UV exposure.

TABLE 1

| Monomer | Peel Force in lb/in (N/m) | |
| --- | --- | --- |
| | Before UV exposure | After UV exposure |
| Diacrylates | | |
| diethylene glycol diacrylate | 0 (0) | 7.9 (1.3) |
| triethylene glycol diacrylate | 0 (0) | 11.3 (1.9) |
| tripropylene glycol diacrylate | 6.8 (1.1) | 6.9 (1.2) |
| tetraethylene glycol diacrylate | 0 (0) | 7.8 (1.3) |
| polyethylene glycol 200 diacrylate | 0 (0) | 5.6 (0.95) |
| c14–c15 terminate diacrylate | 3.8 (.64) | 5.8 (.98) |
| 1,4-butanediol diacrylate | 2.1 (.35) | 8.2 (1.4) |
| 1,3-butyleneglycol diacrylate | 1.2 (.20) | 5.8 (.98) |
| 1,6-hexanediol diacrylate | 2.5 (.42) | 13.0 (2.2) |
| neopentylglycol diacrylate | 4.1 (.69) | 7.5 (1.3) |
| ethoxylated bisphenol A diacrylate | 2.3 (.39) | 8.2 (1.4) |
| propoxylated neopentyl glycol diacr. | 1.5 (.25) | 3.0 (.51) |
| Triacrylates | | |
| trimethylolpropane triacrylate | 3.1 (.59) | 11.2 (1.9) |
| tris(2-hydroxyethyl)isocyanurate triacrylate | 0 (0) | 5.2 (.88) |
| pentaerythritol triacrylate | 0 (0) | 6.5 (1.1) |
| ethoxylated trimethylolpropane triacrylate (TMPTA) | 0.8 (.14) | 7.5 (1.3) |
| highly ethoxylated TMPTA | 0 (0) | 5.6 (.95) |
| propoxylated TMPTA | 0.8 (.14) | 10.2 (1.7) |
| highly propoxylated TMPTA | 0 (0) | 6.7 (1.1) |
| glycerol propoxy triacrylate | 0 (0) | 9.3 (1.6) |
| Other acrylates | | |
| ethoxylated pentaerythritol tetraacrylate | 0 (0) | 6.5 (1.1) |
| dipentaerythritol pentaacrylate | 0 (0) | 6.0 (1.0) |
| polybutadiene diacrylate | 2.5 (.42) | 2.5 (.42) |
| ethoxylated bisphenol A dimethacrylate | 5.6 (.95) | 11.0 (1.9) |

Example 3

Photosensitive compositions were blended in a twin screw extruder and extruded directly onto the primed PET film. The photosensitive composition has the same components as listed in Example 2 with the addition of 0.5 parts by weight Sunolite™ (hydrocarbon wax). Three different acrylate monomer mixtures were used. The acrylate monomer in Example 3A was 4 parts by weight hexane diol diacrylate(HDODA)/3 parts hexane diol methacrylate(HDODMA)/3 parts trimethylol propane triacrylate(TMPTA). The acrylate monomer in Example 3B was 5 parts HDODA/5 parts HDODMA. The acrylate monomer in Example 3C was ethoxylated bisphenol A diacrylate. Again the adhesion was tested before and after exposure to UV light. The results are shown in Table 2.

TABLE 2

| Example # | Peel Force in lb/in (N/m) | |
| --- | --- | --- |
| | Before UV exposure | After UV exposure |
| Example 3A | 4.3 (0.73) | 13.0 (2.2) |
| Example 3B | 4.3 (0.73) | 13.0 (2.2) |
| Example 3C | 2.5 (0.42) | 19.4 (3.3) |

Example 4

Photosensitive compositions were prepared with various levels of ethoxylated bisphenol A diacrylate. The amounts of Picotex™, Erganox™, Irgacure™, and Sunolite™ were held constant at the levels recited in Example 2. The amount of Kraton™ was adjusted according to the amount of acrylate used. The samples were prepared from solvent blending as in Example 2, and were pressed with heat onto the CX-100™ coated PET. The length of exposure to UV radiation was varied as shown in Table 3. Peel force was measured.

TABLE 3

| wt. % acrylate | PEEL FORCE IN lb/in (N/m) Exposure time (sec) | | | | | |
| --- | --- | --- | --- | --- | --- | --- |
| | 10 | 20 | 30 | 40 | 50 | 60 |
| 5 | 5.0 (.8) | 5.2 (.9) | 6.0 (1) | 8.3 (1.4) | 7.2 (1.2) | 7.1 (1.2) |
| 7 | 8.4 (1.4) | 5.8 (1) | 6.0 (1) | 5.5 (.9) | 7.2 (1.2) | 7.2 (1.2) |
| 10 | 4.8 (.8) | 6.2 (1) | 6.3 (1.1) | 5.8 (1) | 6.0 (1) | 5.6 (.9) |
| 13 | 8.0 (1.4) | 8.5 (1.4) | 7.8 (1.3) | 9.4 (1.6) | 7.2 (1.2) | 8.4 (1.4) |

Example 5

Three photosensitive compositions were prepared by solvent blending. Each composition contained 5% Sartomer™ 349 (ethoxylated bisphenol A diacrylate monomer), 7.4% Picotex 120™, 0.5% Erganox 1076™ and 1.3% Irgacure 651™. The remaining 85.8% was some combination of polybutadiene (BD300™) and Kraton™ 1117. The photosensitive compositions were applied to the primed PET and tested for peel force after 40 second exposures to UV radiation. The results are shown in Table 4.

TABLE 4

| Wt. % BD300 | Wt. % Kraton 1117 | Peel Force in lb/in (N/m) |
| --- | --- | --- |
| 10 | 75.8 | 13.8 (2.33) |
| 15 | 70.8 | 11.4 (1.93) |
| 25 | 60.8 | 0.0 (0.0) |

Example 6

Three photosensitive compositions were prepared by extrusion melt blending and were extruded onto the aziridine primed PET. Each composition contained 5% Sartomer™ 349, 7.4% Picotex 120™ 0.5% Erganox 1076™ and 1.3% Irgacure 651™. The BD300 was increased from 5 wt%, to 10 wt% to 15 wt.% and the Kraton™ 1117 was decreased accordingly. The samples were exposed to UV radiation for various time periods and then peel tested. The results are shown in Table 5.

TABLE 5

| % BD300 | PEEL FORCE IN lb/in (N/m) Exposure time (sec) | | | | |
| --- | --- | --- | --- | --- | --- |
| | 5 | 10 | 20 | 30 | 40 |
| 5 | 2.2 (.4) | 5.6 (.9) | 8.0 (1.4) | 8.8 (1.5) | 8.8 (1.5) |
| 10 | 1.8 (.3) | 8.0 (1.4) | 11.4 (1.9) | 12.4 (2.1) | 13.2 (2.2) |
| 15 | 3.5 (.6) | 8.0 (1.4) | 9.8 (1.7) | 11.2 (1.9) | 11.0 (1.9) |

Example 7

A roll of 7 mil (0.18 mm) polyester film (A) was corona treated in air. The corona treater was run at a speed of 11 m/min. The treated film was coated with CX100™ (0.4% solid aziridine in isopropyl alcohol). The web was run at 15 m/min. and dried between 94° and 106° C. The coating thickness was several hundred angstroms. A 35 mil (0.89 mm) photosensitive elastomeric layer (B) was extruded onto the treated film A. This photosensitive elastomeric composition was cured by exposure to ultraviolet light. Following the curing of layer B, a second photosensitive elastomeric layer (C) was extruded directly onto layer B. Layer C was 25 mil (0.64 mm) thick.

The composition of layer B in weight % is:
80.3% SIS block copolymer
10.0% ethoxylated bisphenol A diacrylate
7.4% poly(alphamethylstyrene/vinyl toluene)
0.5% antioxidant
1.3% Irgacure 651™
0.5% hydrocarbon wax The composition of layer C in weight % is:
55.3% SIS block copolymer
35.0% polybutadiene diacrylate
7.4% poly(alphamethylstyrene/vinyl toluene)
0.5% antioxidant
1.3% Irgacure 651™
0.5% hydrocarbon wax A 5 mil (0.13 mm) polyester film (E) was coated with a 0.2% solution of vanadium pentoxide. The vanadium pentoxide solution was prepared from 0.1% vanadium pentoxide and 0.1% surfactant in de-ionized water. After drying, the coating weight was 15 mg/m². To the coated film E was added a coating (D) of a 10% polyamide solution in n-propyl alcohol and toluene. A small amount of FC170 surfactant (3M) was added to adjust adhesion. The dried coating weight of the polyamide layer D was 0.19 mg/cm². The multilayer sheet D-E was laminated to the multilayer sheet A-B-C such that layer D contacted layer C. The final multilayer structure was 67 mil (1.7 mm) thick.

This multi-layer flexible plate was imagewise exposed and developed as follows. Layer E was removed and a negative image bearing film was placed against the flexible plate. To produce reverse images on the plate, exposure to UV radiation was 3 minutes. To produce a bar code pattern, exposure to UV radiation was 9 minutes. For other patterns, exposure through a negative film occurred for 15 minutes. After exposure, the plate was developed by contact with an absorbent material at an elevated temperature. Both the absorbent material and the image exposed plates was attached to heated transport elements. The element carrying the absorbent material was maintained at approximately 175° C. while the temperature of the element carrying the flexographic plate was 60° C. After 10 contacts a flexographic printing plate exhibiting a very clean floor with 25 mil (0.64 mm) relief and 35 mil (0.89 mm) floor was obtained.

What is claimed is:

1. A flexible plate comprising
   a flexible substrate primed with an aziridine functional material, and contacting the primed substrate,
   a first photosensitive layer which comprises a substantially polar acrylate compound, an elastomeric block copolymer, and a photoinitiator, and a second photosensitive layer over the first photosensitive layer, the second photosensitive layer being applied to the first photosensitive layer after the first photosensitive layer is cured by exposure to radiation wherein the second photosensitive layer comprises an acrylate compound, an elastomeric block copolymer, and a photoinitiator and the acrylate compound of the second photosensitive layer is polybutadiene diacrylate.

2. A flexographic printing plate comprising a) a flexible substrate primed with an aziridine functional material, b) a first layer which contacts the primed surface of the substrate and which comprises the photoinitiated reaction product of photosensitive precursors comprising an acrylate compound which is substantially polar, an elastomeric block copolymer, and a photoinitiator, and c) a second relief bearing layer over the first layer, the second layer comprising the photoinitiated reaction product of photosensitive precursors comprising an acrylate compound, an elastomeric block copolymer, and a photoinitiator, in which the acrylate compound of the second layer is polybutadiene diacrylate.

3. The flexographic plate of claim 2 in which the substantially polar acrylate compound of the first layer is ethoxylated bisphenol A diacrylate and the photosensitive precursors of the first layer further comprise polybutadiene diacrylate in amounts no greater than 80% by weight of acrylate compounds.

4. A flexographic printing plate comprising a) a flexible substrate primed with an aziridine functional material, b) a first layer which contacts the primed surface of the substrate and which comprises the photoinitiated reaction product of photosensitive precursors comprising an acrylate compound which is substantially polar, an elastomeric block copolymer, and a photoinitiator, and c) a second relief bearing layer over the first layer, the second layer comprising the photoinitiated reaction product of photosensitive precursors comprising an acrylate compound, an elastomeric block copolymer, and a photoinitiator in which the elastomeric block copolymer in both the first and second layers is a styrene-isoprene-styrene block copolymer.

* * * * *